United States Patent [19]

Osaki et al.

[11] Patent Number: 5,107,153
[45] Date of Patent: Apr. 21, 1992

[54] DELAY CIRCUIT AND LATCH CIRCUIT FOR CONTROLLING SETUP TIME AND HOLD TIME OF PULSE SIGNALS

[75] Inventors: Akitoshi Osaki; Akira Yamada, both of Itami, Japan

[73] Assignee: Mitsubishi Denki Kabushiki Kaisha, Tokyo, Japan

[21] Appl. No.: 608,145

[22] Filed: Nov. 1, 1990

[30] Foreign Application Priority Data

Jan. 24, 1990 [JP] Japan .................................. 2-15393

[51] Int. Cl.[5] ......................... H03K 5/13; H03K 17/16
[52] U.S. Cl. ..................................... 307/601; 307/603; 307/606; 328/55
[58] Field of Search ............... 307/602, 605, 606, 353, 307/443, 451, 470, 471, 601, 603, 608, 593; 328/55

[56] References Cited

U.S. PATENT DOCUMENTS

| | | | |
|---|---|---|---|
| 4,042,842 | 8/1977 | Hegendorfer | 307/605 |
| 4,424,456 | 1/1984 | Shiraki et al. | 307/451 |
| 4,694,208 | 9/1987 | Szabo et al. | 307/603 |
| 4,785,253 | 11/1988 | Hughes | 328/167 |
| 5,012,143 | 4/1991 | Boudewijns | 307/606 |

*Primary Examiner*—Stanley D. Miller
*Assistant Examiner*—Toan Tran
*Attorney, Agent, or Firm*—Townsend and Townsend

[57] ABSTRACT

A delay circuit composed of a plurality of series circuits connected to each other in parallel, wherein each of series circuits is composed of a switching element made of FET like N-channel transistor and a capacitor. And a semiconductor system which allows proper connection of other semiconductor systems containing different AC charcteristics by delaying internal clock, input pulse signal or output pulse signal by applying the delay circuit embodied by the invention.

1 Claim, 13 Drawing Sheets

DELAY CIRCUIT AND LATCH CIRCUIT FOR CONTROLLING SETUP TIME AND HOLD TIME OF PULSE SIGNALS

BACKGROUND OF THE INVENTION

1. Field of the Invention

This invention relates to a delay circuit which determines delay amount of pulse signals by changing the capacity and a semiconductor device which can be connected to other semiconductor devices containing different signal setup time and hold time by applying this delay circuit.

2. Description of Related Art

Any conventional semiconductor system like a digital integrated circuit incorporates a number of input/output terminals receiving and externally transmitting a variety of pulse signals and a clock terminal receiving external clock pulses. Conventionally, one kind of proper setup time and hold time are prescribed respectively for input terminals. The terms "setup time" and "hold time" respectively designate a kind of the timing condition when delivering an input signal to more than two kinds of input terminals of a semiconductor device.

Concretely, the term "setup time" designates such a specific moment at which a semiconductor device can correctly execute the prescribed operation in such a state where the signal condition of another input terminal is remained at a specific level a certain seconds before allowing an input signal (received by a terminal like a clock input terminal for example) to vary itself. On the other hand, the term "hold time" designates such a specific moment at which a semiconductor device can correctly execute the prescribed operation in such a state where the signal condition of another input terminal is remained at a specific level a certain seconds after causing an input signal (received by a terminal like a clock input terminal for example) to vary itself. Conventionally, the "setup time" and the "hold time" are collectively called "AC characteristic" of input terminals. Referring now to the timing chart shown in FIG. 2, a concrete example of the "AC characteristic" is described below.

Now, a consideration is given in regard to a case in which a semiconductor device executes a specific operation by applying an input signal SI at the falling edge of an input latch clock LCLK. The input signal SI goes HIGH at a moment T1-second earlier than the falling edge of the input latch clock LCLK, and then, after staying at HIGH level for a period corresponding to T1+T2 seconds, the input signal SI goes LOW. As shown in FIG. 2-d, the semiconductor device can execute the predetermined operation based on an input signal when the setup time of the input terminal is ST<T1 and the hold time HT<T2. On the other hand, as shown in FIG. 2-c, the setup time of the input terminal is ST<T1. However, since the time T2 does not satisfy the hold time HT when the hold time HT is longer than the time T2 (HT>T2), the semiconductor system does not execute the predetermined operation. As a result, as shown in FIG. 2-c, when feeding the input signal SI to the semiconductor device containing the relationship HT>T2, it is essential for the semiconductor device to delay the input signal SI in order that the input signal SI can remain in the relationship HT<T2. Accordingly, as shown in FIG. 2-c and -d, when feeding the identical input signal SI to a pair of semiconductor devices containing setup time and hold time, that is, different AC characteristics, it is essential for any conventional semiconductor device to delay the input signal that is to be delivered to such a semiconductor device containing a short setup time and a long hold time in order that the input signal can satisfy the AC characteristic.

The description above will be explained referring to the drawings.

FIG. 1 illustrates an example of the connection between a pair of conventional semiconductor devices having different AC characteristics while feeding input signal to these. FIG. 2 illustrates the timing chart. The reference numerals 2 and 3 respectively designate a pair of semiconductor devices containing the setup time and the hold time which are different from each other. As shown in FIG. 2-c, the value of the setup time ST of an input terminal 21 of a semiconductor device 2 is shorter than that of the other input terminal 31 of the other semiconductor device 3. Conversely, the value of the hold time of the input terminal 21 is longer than that of the other input terminal 31. Since the input terminal 21 has the hold time HT which is longer than the time T2, input signal SI is delivered to the input terminal 21 via a delay element 10. The delivered input signal SI is latched at the falling edge of input latch clock LCLK which has been given to the clock input terminals 22, 32. When latching the input signal SI which has been delivered to the input terminals 21 and 31 at the falling edge of the input latch clock LCLK, if the input signal SI is directly delivered to the input terminal 21 without being routed through the delay element 10, since time T1 (a period in which the input latch clock LCLK varies itself at the falling edge after the input signal SI goes HIGH) is longer than the setup time ST of the input terminal 21, no problem arises. Nevertheless, since time T2 (a period in which the input signal SI remains HIGH after causing the input latch clock LCLK to vary itself at the falling edge) is shorter than the predetermined hold time HT, the semiconductor device 2 cannot execute the prescribed operation. As a result, there is a need of delaying the input signal SI by operating the delay element 10 in order that the input signal SI can become compatible with the AC characteristic of the input terminal 21 to cause the time T2 (a period in which the input signal SI holds the value after the input latch clock LCLK varies) to satisfy the hold time HT.

On the other hand, proper value of delay time per output terminal of any conventional semiconductor device is prescribed. When feeding signal output from one of a pair of the connected semiconductor devices to the other semiconductor device synchronous with the input latch clock LCLK, since the input terminal of the other semiconductor device contains the AC characteristic shown in FIG. 2-c, when externally feeding the signal output from this semiconductor device on the basis of the timing shown in FIG. 2-b, this semiconductor device also needs to delay the output signal.

The Japanese Laid-Open Patent Publication No. 61-160128 of 1986 discloses an integrated circuit reflecting one of those prior arts intended for solving the above problem. The disclosed integrated circuit incorporates a delay circuit for determining the delay amount of internal clock pulse against external clock pulse in order to permit the connection between a plurality of semiconductor devices containing own setup time and hold time different from each other. FIG. 3 illustrates the schematic block diagram of the semiconductor device disclosed in the above publication. A delay circuit 11 is installed in a semiconductor device 2. The delay circuit 11 incorporates a plurality of delay elements 10 each being provided with a predetermined delay amount, a plurality of delay routes which connects these delay elements 10 in one or more than one series respectively receiving an external clock pulse EXCLK, and then, the delay circuit 11 causes the delay amount to vary itself by causing an internal-clock selecting circuit 5 to select the delay route by applying a control signal CTRL from an external source. In consequence, this prior art can connect these semiconductor devices containing different AC characteristics without necessarily providing delay elements outside of the semiconductor device. This semiconductor device can be offered to a variety of practical uses.

Nevertheless, since the delay circuit 11 contains a plurality of delay routes incorporating a plurality of delay elements 10, in order to prepare n-kinds of delay amount, the delay circuit 11 needs to prepare n-units of delay routes. This results in the expanded area of the delay circuit occupying the interior of the semiconductor device, thus causing the own size of the semiconductor device to be enlarged.

SUMMARY OF THE INVENTION

The invention has been achieved to solve those problems mentioned above. The primary object of the invention is to provide a novel delay circuit which properly sets delay amount by applying combination of opening and closing of switching elements, in which the delay circuit is composed of a plurality of circuits each incorporating a plurality of switching elements and capacitors connected in series, the plurality of circuits being connected to each other in parallel. Even when the set number of the delay amount increases, these delay circuits merely occupy minimal area without substantially expanding the total area. The other object of the invention is to provide a semiconductor device which incorporates the above delay circuit and is capable of connecting with other semiconductor devices having different AC characteristics.

When operating the delay circuit embodied by the invention, the input pulse signal is outputted with a certain delay by the delay amount ruled by electrostatic capacity which is determined by the combination of the opening and closing of switching elements. Since the set number of the delay amount is determined by the combination of the opening and closing of switching elements, the circuit area is minimized without expansion in contrast with the increased set number of delay amount.

When operating the semiconductor device embodied by the invention, on receipt of an external clock pulse, an internal clock pulse is generated, and then the delay circuit delays the generated internal clock pulse by the predetermined period of time. As a result, the semiconductor device can be connected to other semiconductor devices each having different AC characteristic.

Furthermore, when receiving and transmitting signals, the semiconductor device delays the pulse signal at the time of inputting and outputting the pulse signal for the predetermined period of time set in the delay circuit in order that the semiconductor device itself can normally be connected to other semiconductor devices having different AC characteristic.

The above and further objects and features of the invention will more fully be apparent from the following detailed description with accompanying drawings.

Figure 1:
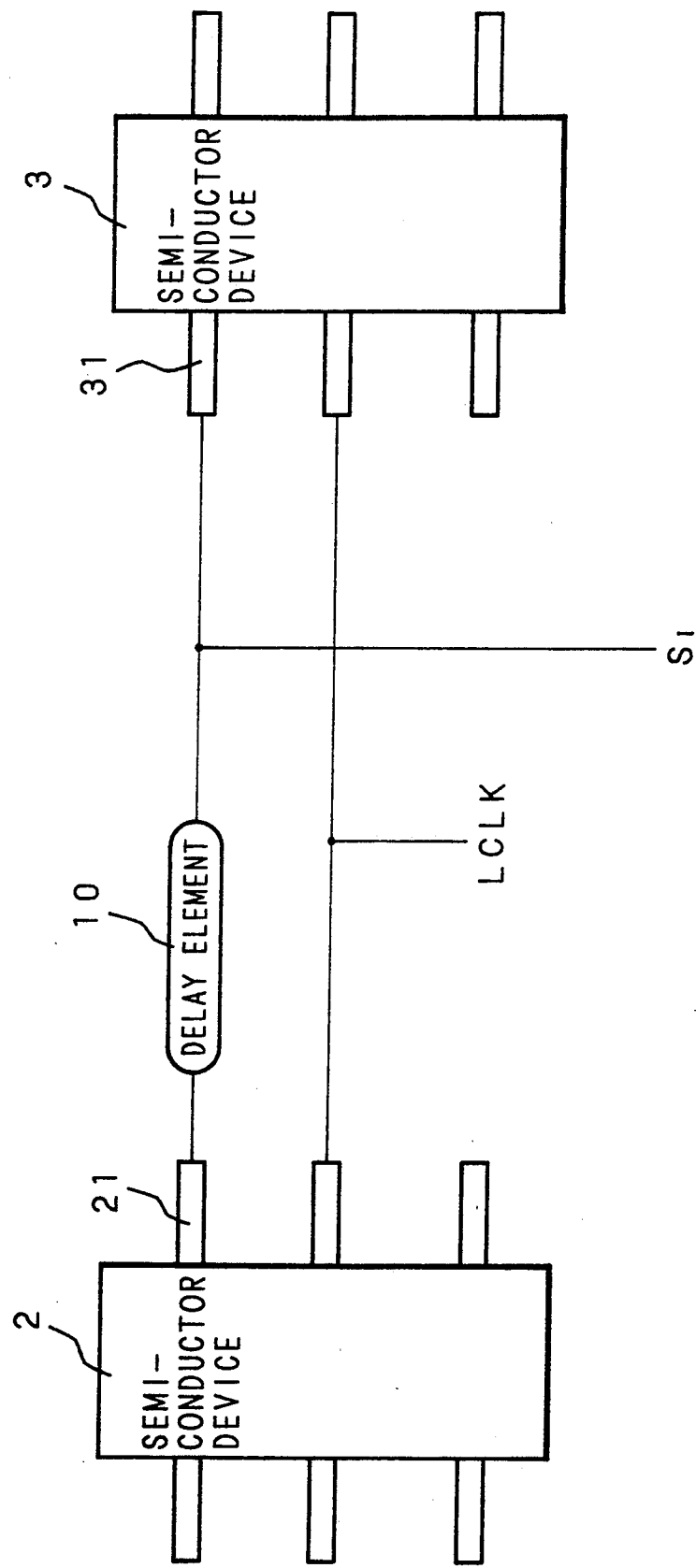
FIG. 1 illustrates the schematic block diagram of an example of the connected conventional semiconductor devices each containing different AC characteristic.

The above and further objects and the features of the invention will more fully be apparent from the following detailed description in reference to the accompanying drawings.

DESCRIPTION OF THE PREFERRED EMBODIMENTS

Referring now more particularly to the accompanying drawings, embodiments of the invention are described below. The reference numeral 2 shown in FIG. 4 designates a semiconductor device. External clock pulse EXCLK is transmitted to an internal clock generator 9 from an external source via a clock terminal 22. As a result, on the basis of the external clock pulse EXCLK, internal clock pulse CLK is generated.

Output node of the internal clock generator 9 is connected to a grounded capacitor 5a and 5b being connected in parallel, which are connected in series to an N-channel transistor 4a or 4b which substantially composes a switching element. A delay circuit 6 is composed of the combination of the N-channel transistors 4a and 4b with the capacitors 5a and 5b. Control signals CTRL1 and CTRL2 are independently delivered to gates of these N-channel transistors 4a and 4b. In response to the signal level HIGH or LOW, the N-channel transistors 4a and 4b respectively open and close themselves. The control signals CTRL1 and CTRL2 may respectively be delivered from an external source of these control signals may internally be generated by changing light-exposure mask. The capacitors 5a and 5b respectively contain electrostatic capacity Ca and Cb, which are in the relationship Ca<Cb.

In response to the opening and closing of the N-channel transistors 4a and 4b, load capacity of the output terminal of the internal clock generator 9 is established. This in turn allows the delay circuit 6 to gain four units of static capacity. On the basis of this, four units of delay amount can be provided for the internal clock pulse CLK against the external clock pulse EXCLK.

Figure 5:
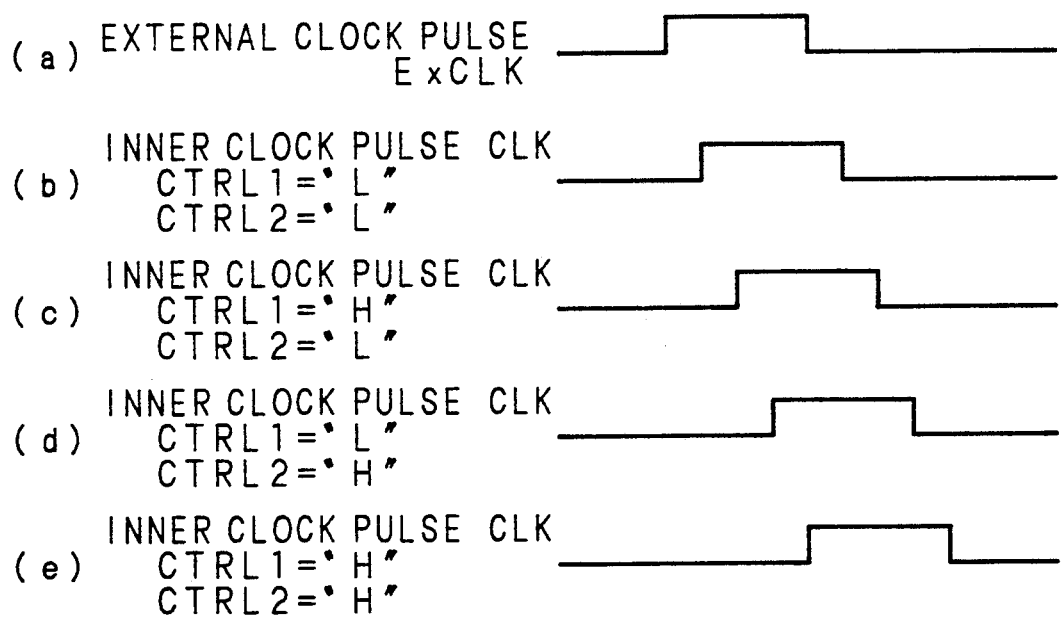
FIG. 5 illustrates the timing chart of the delay circuit embodied by the invention.

FIG. 5 illustrates the timing chart designating the relationship between the delay time of the internal clock pulse CLK of the delay circuit 6 and the status of the control signals CTRL1 and CTRL2. FIG. 5-b designates the state in which the control signals CTRL1 and CTRL2 respectively remain LOW. FIG. 5-c designates the state in which the control signal CTRL1 remains HIGH, whereas the control signal CTRL2 remains LOW. FIG. 5-d designates the state in which the control signal CTRL1 remains LOW, whereas the control signal CTRL2 remains HIGH. FIG. 5-e designates the state in which the control signals CTRL1 and CTRL2 respectively remain HIGH. When the state shown in FIG. 5-b is present, since CTRL1 and CTRL2 respectively remain LOW, the N-channel transistors 4a and 4b are respectively open, and thus, the internal clock pulse is not subject to delay. When the state shown in FIG. 5-c is present, since CTRL1 remains HIGH and CTRL2 remains LOW, the N-channel transistor 4a is closed, whereas the other transistor 4b remains open. As a result, the delay circuit 6 can gain such a delay amount corresponding to the capacity of the capacity 5a. Likewise, when the state shown in FIG. 5-d is present, the delay circuit 6 can gain such a delay amount corresponding to the capacity of the capacitor 5b. When the state shown in FIG. 5-e is present, the delay circuit 6 can gain such a delay amount corresponding to the sum of the capacitances of the capacitors 5a and 5b.

Figure 4:
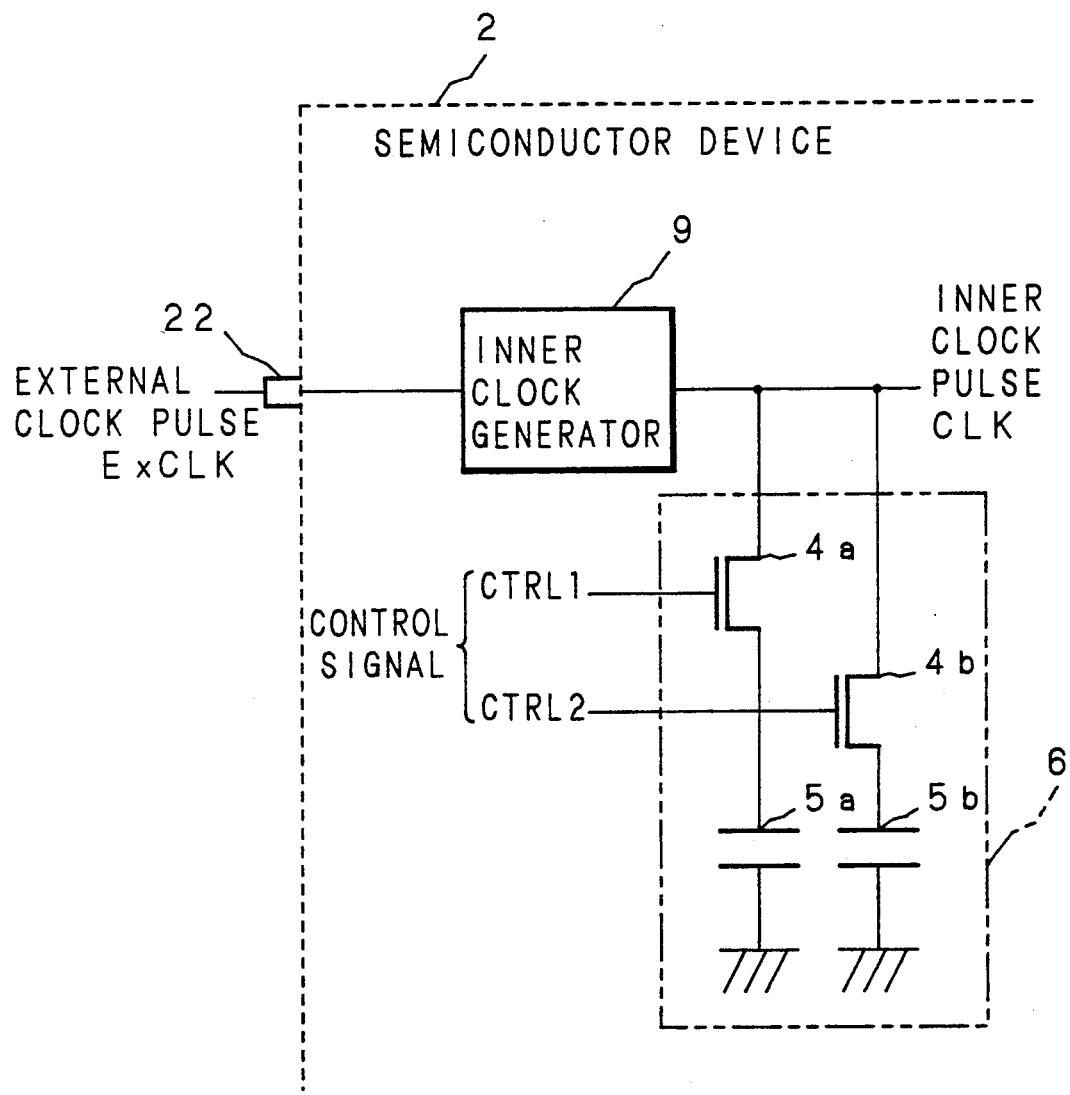
FIG. 4 illustrates the schematic block diagram of the delay circuit embodied by the first invention.
Figure 6:
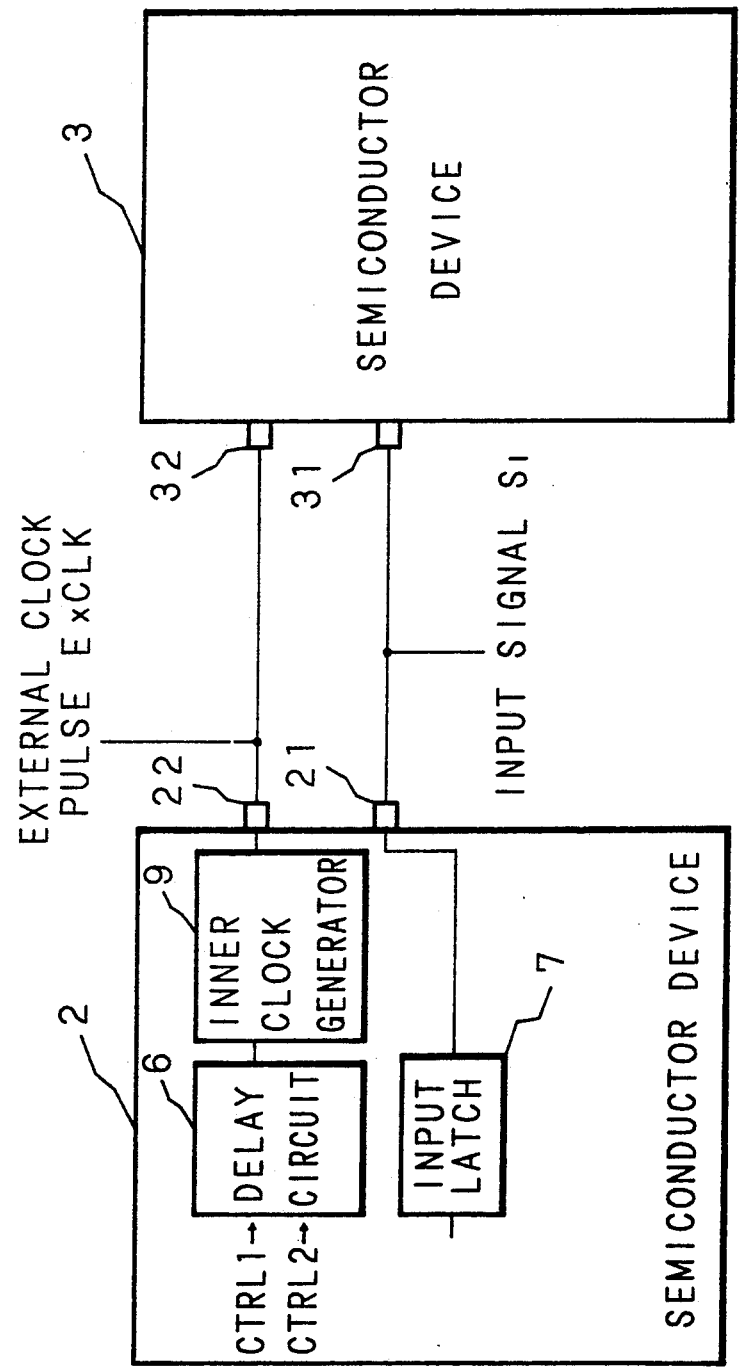
FIG. 6 illustrates the schematic block diagram of the semiconductor device related to the second invention.

Next, the semiconductor device reflecting the second invention is described below. FIG. 6 illustrates the state of the connection between a pair of semiconductor devices each containing different AC characteristic. The reference numeral 2 shown in FIG. 6 designates the semiconductor device related to the second invention. The delay circuit 6 of the first invention shown in FIG. 4 is installed inside of the semiconductor device 2. Input signal SI is delivered to an input terminal 21, whereas external clock pulse EXCLK is delivered to a clock terminal 22. Likewise, the input signal SI is also delivered to an input terminal 31 of a semiconductor system 3, whereas the external clock pulse EXCLK is also delivered to a clock terminal 32. The input terminal 31 of the semiconductor device 3 contains such AC characteristic different from that of the input terminal 21 of the semiconductor device 2. The semiconductor device 3 contains setup time ST which is shorter than that of the semiconductor device 2, but instead, it has such hold time longer than that of the semiconductor device 2. As a result, if the semiconductor devices 2 and 3 respectively latch the input signal SI on the basis of the timing identical to the timing which satisfies the AC characteristic of the semiconductor device 3, then the semiconductor device 2 cannot gain enough setup time ST, and as a result, it cannot properly latch the input signal SI.

After being led into the clock terminal 22, the external clock pulse EXCLK is then delivered to the internal clock generator 9, which then generates internal clock pulse CLK for delivery to the delay circuit 6. According to the states of the control signals CTRL1 and CTRL2, the delay circuit 6 contains preliminarily established delay amount. The delay circuit 6 delays the internal clock pulse CLK by the predetermined delay amount, and then delivers this internal clock pulse CLK to an input latch 7 as an input latch clock LCLK for determining the timing to latch the input signal SI which has been received from the input terminal 21.

Figure 7:
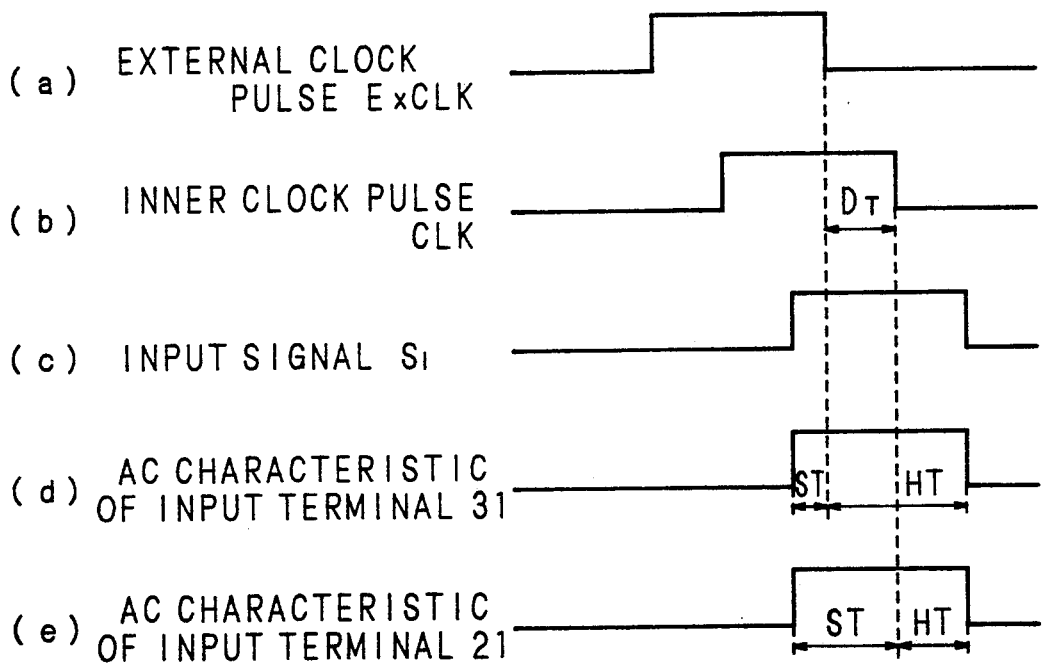
FIG. 7 illustrates the timing chart designating the AC characteristic when the semiconductor device of the invention is connected another semiconductor device.

FIG. 7 illustrates the timing chart when both the external clock pulse EXCLK and the input signal SI are received. For example, the timing chart of FIG. 7 designates the case where there is a need for delaying the external clock pulse EXCLK by the delay amount depending on the electrostatic capacity of the capacitor 5a in correspondence with the AC characteristic of the input terminals 21 and 31. When the external clock pulse EXCLK is delivered to a clock terminal 22, the internal clock generator 9 generates internal clock CLK. The delay circuit 6 delays this clock pulse CLK by the predetermined delay amount Dr, and then outputs the delayed clock to the input latch 7. On the other hand, the input terminals 21 and 31 respectively contain the AC characteristics shown in FIG. 7e and 7d. By delaying the internal clock pulse CLK, the apparent AC characteristic seen from the input terminals 21 and 31 becomes identical to each other. This allows the semiconductor devices respectively having input terminals of different AC characteristics to properly be connected to each other.

Figure 8:
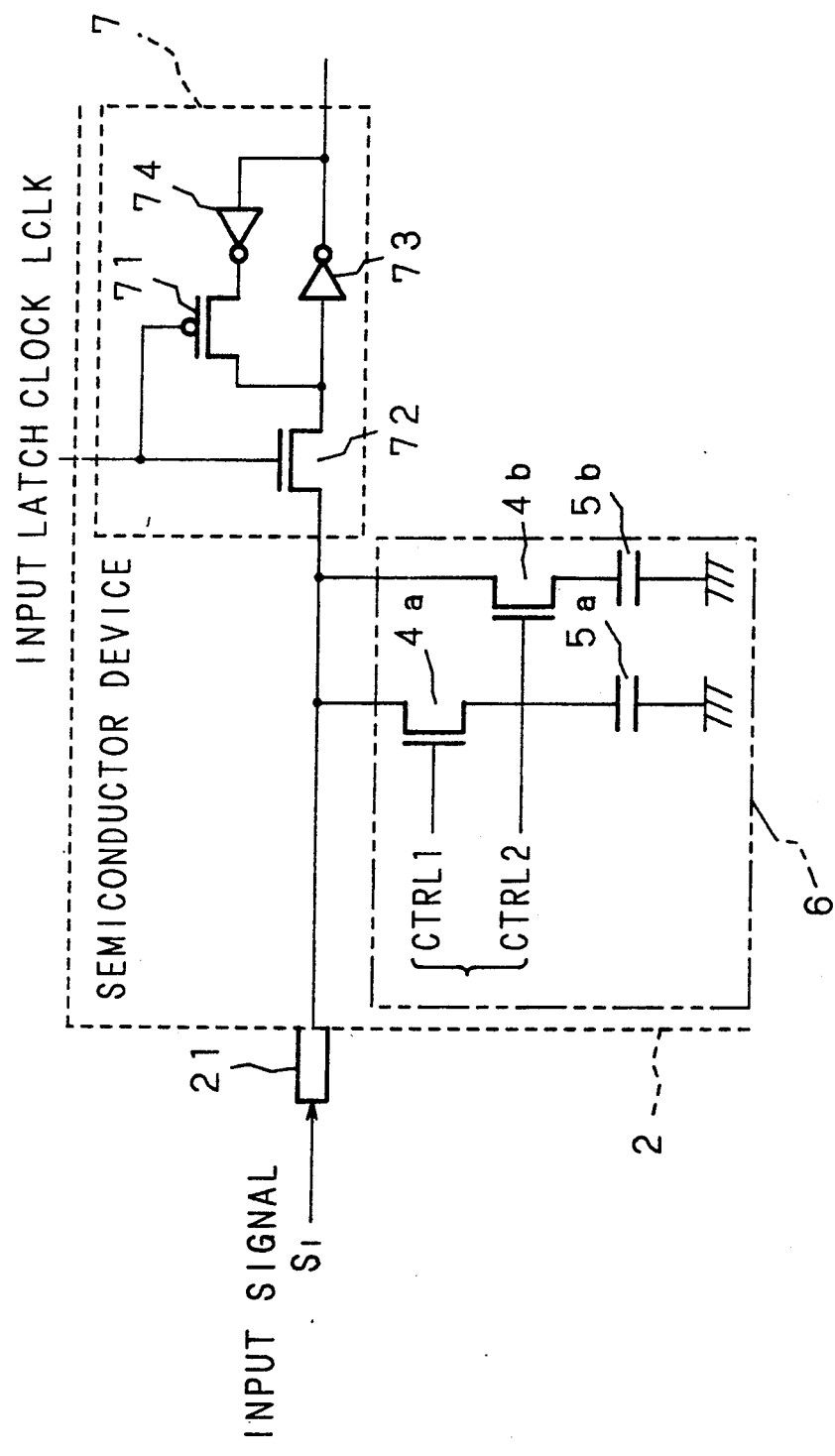
FIG. 8 illustrates the detailed block diagram of the semiconductor device related to the third invention.

Next, the semiconductor device related to the third invention is described below. FIG. 8 illustrates the detailed block diagram of the essential elements of the semiconductor device related to the third invention. Input signal SI transmitted from an input terminal 21 is delayed by a delay circuit 6 of the first invention according to the states of control signals CTRL1 and CTRL2 before being transmitted to an input latch 7. While input latch clock LCLK remains LOW, the input latch 7 holds and outputs the value of the input signal SI when the input latch clock LCLK goes HIGH. The input latch 7 is composed of an N-channel transistor 72, an inverter 74 and a P-channel transistor 71 which are connected to each other in series, and another inverter 73 which is connected in parallel to these elements via an output node of the N-channel transistor 72. These inverters 73 and 74 are in the inverse parallel connection relationship. The input latch clock LCLK is delivered to gates of transistors 71 and 72.

Figure 9:
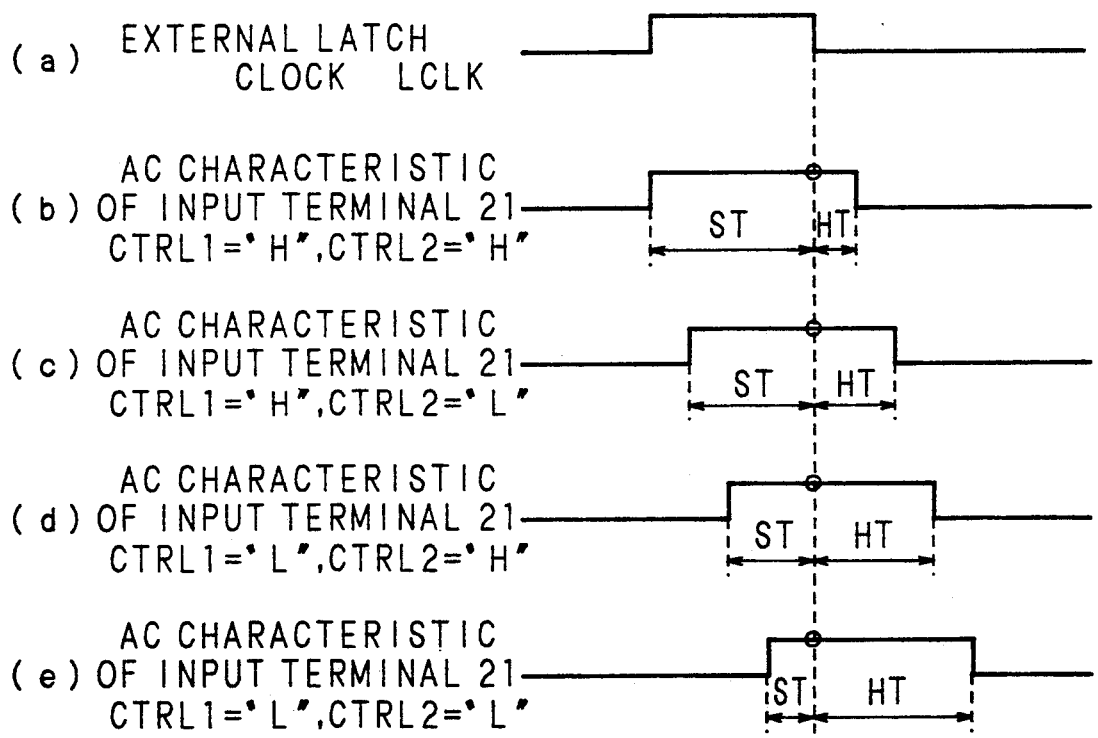
FIG. 9 illustrates the timing chart designating the apparent AC characteristic of input terminal.

FIG. 9 illustrates the timing chart designating the relationship between the states of control signals and the apparent AC characteristic of the input terminal 21. FIG. 9-a designates the input latch clock LCLK. FIG. 9b through 9e respectively designate the apparent AC characteristic of the input terminal 21 according to the states of the control signals CTRL1 and CTRL2.

Figure 2:
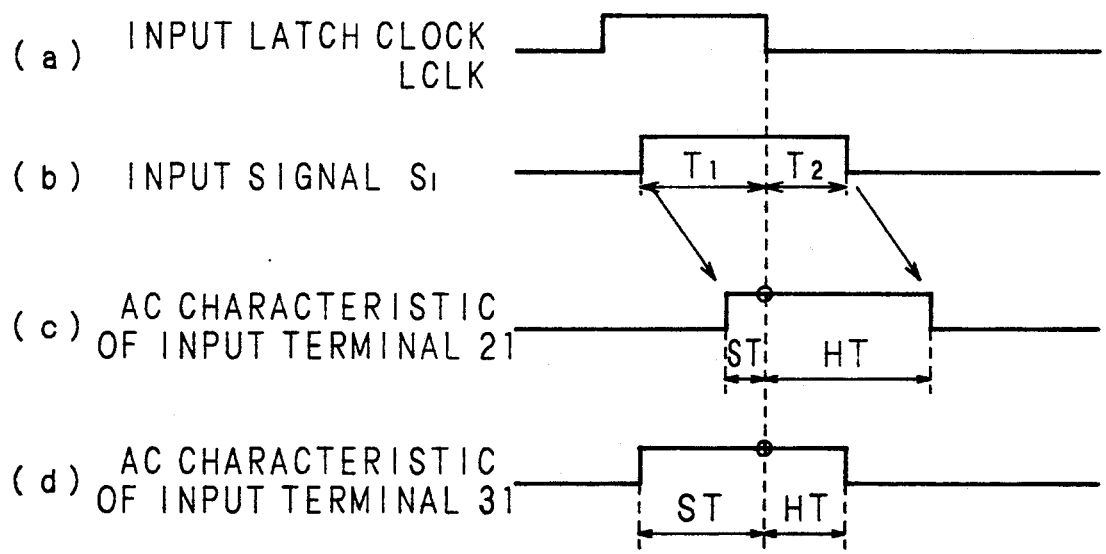
FIG. 2 illustrates the timing chart designating the AC characteristic when conventional semiconductor devices are connected to each other.
Figure 3:
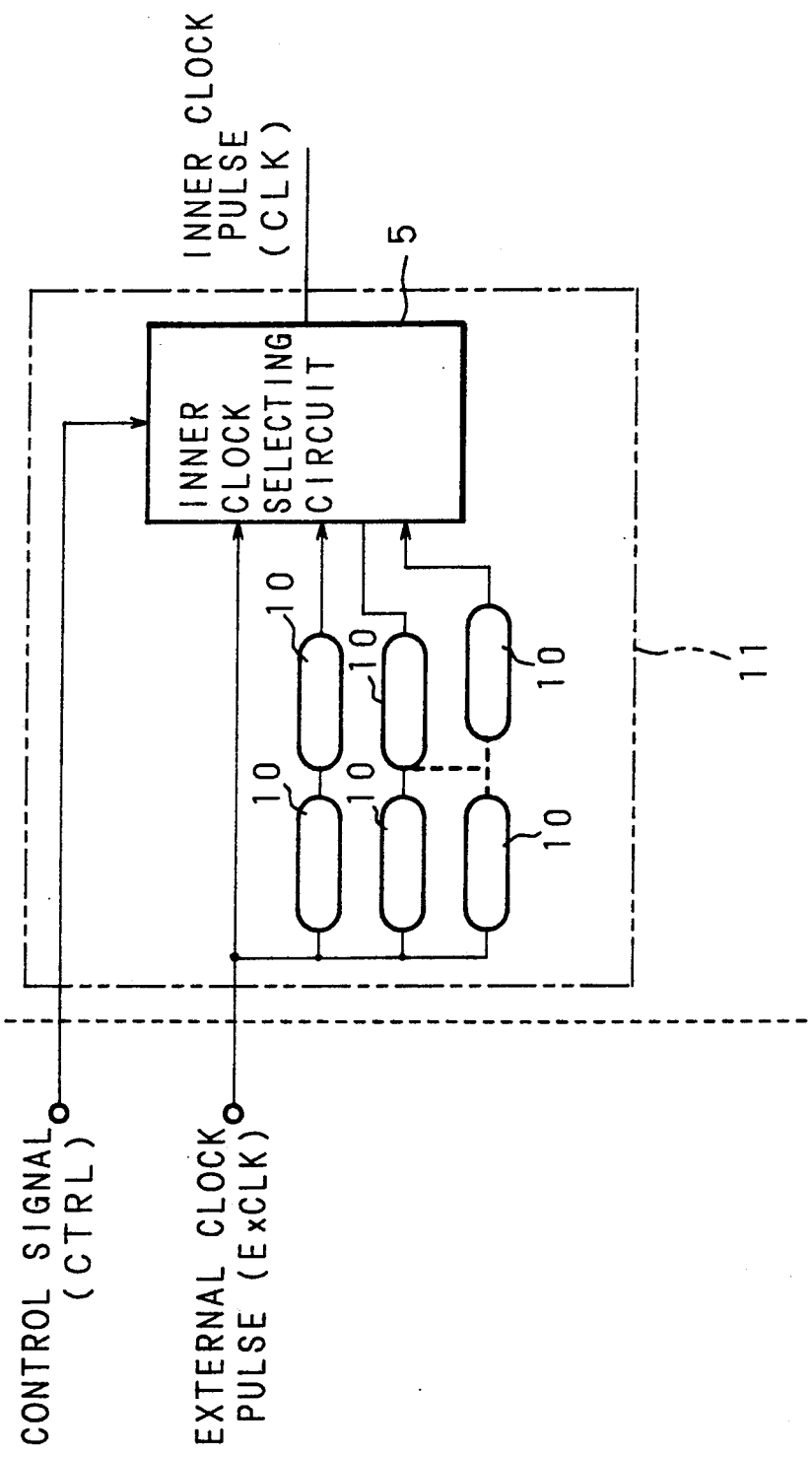
FIG. 3 illustrates the schematic block diagram of a conventional delay circuit.

The true AC characteristic of the input terminal 21 is as shown in FIG. 2-c. This AC characteristic is identical to the AC characteristic while the control signals CTRL1 and CTRL2 respectively remain LOW, in other words, while no delay is present as shown in FIG. 9-e. The true AC characteristic apparently varies itself as shown in FIG. 9-b through 9e in correspondence with the varying states of the control signals CTRL1 and CTRL2 between HIGH and LOW. In other words, the greater the amount of delay, the longer the setup time and shorter the hold time.

Figure 10:
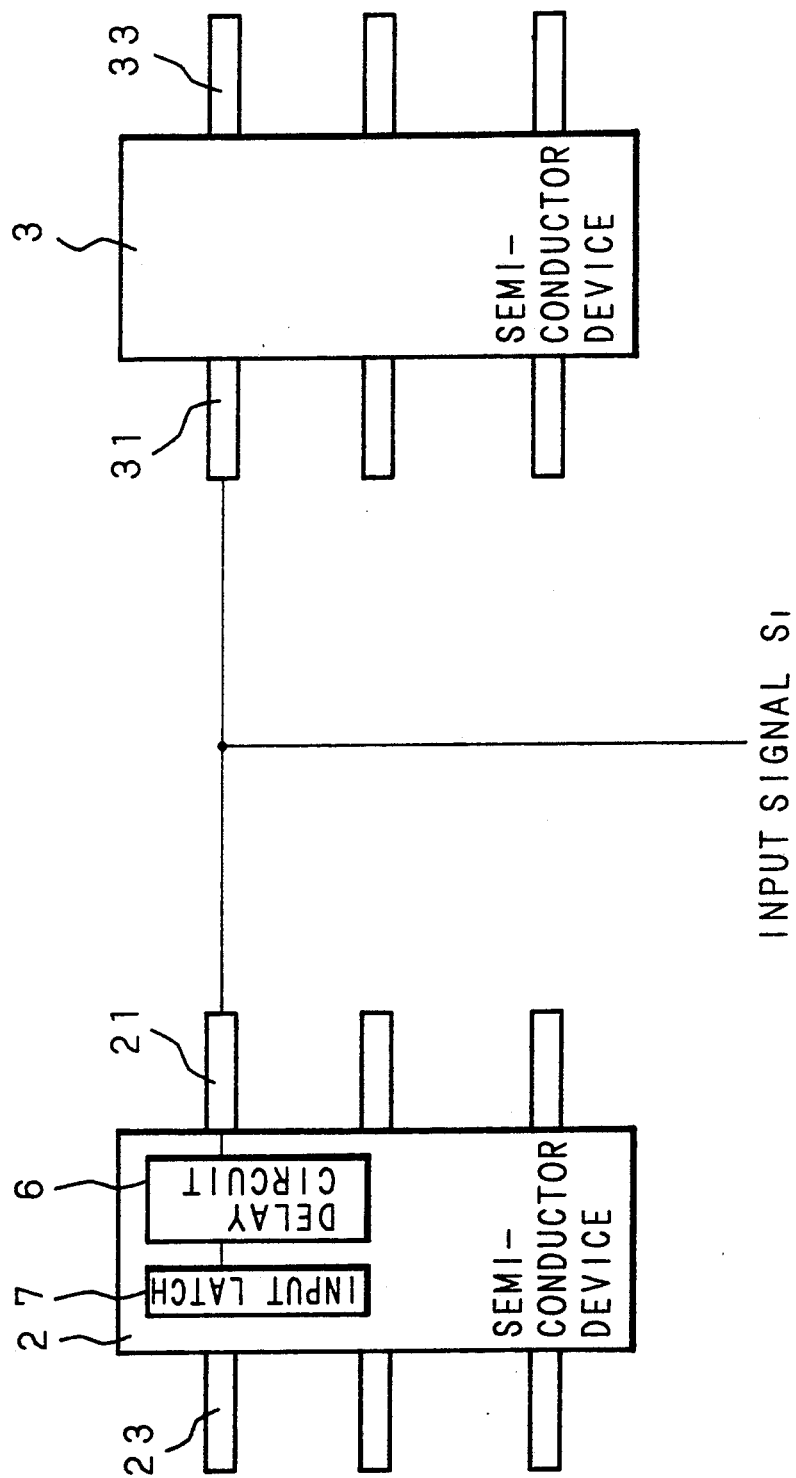
FIG. 10 illustrates the schematic block diagram of an example of the connection of the semiconductor device related to the third invention.
Figure 11:
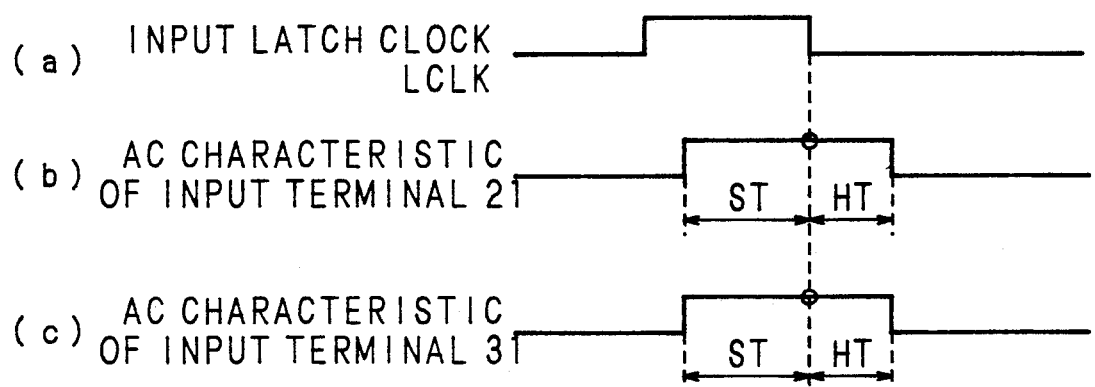
FIG. 11 illustrates the timing chart designating the AC characteristic when the semiconductor is connected.

FIG. 10 illustrates the schematic block diagram of an example of the semiconductor device of the third invention connected to another semiconductor device containing different AC characteristic. Input signal SI is transmitted to input terminals 21 and 31 of these semiconductor devices 2 and 3. FIG. 11 illustrates the AC characteristic of the input terminals 21 and 31. If the AC characteristic of the input terminal 31 is like the one shown in FIG. 9-c and the AC characteristic of the input terminal 21 is like the one shown in FIG. 2-c, then the AC characteristic of the input terminal 21 contains a shorter setup time and a longer hold time than those of the AC characteristic of the input terminal 31. Nevertheless, by holding the control signal CTRL1 at HIGH level and the other control signal CTRL2 at LOW level, and also by causing the delay circuit 6 to delay the input signal SI, the apparent AC characteristic of the input terminal 21 becomes identical to that of the input terminal 31, thus eventually enabling the connection of these semiconductor devices having different AC characteristics.

Figure 12:
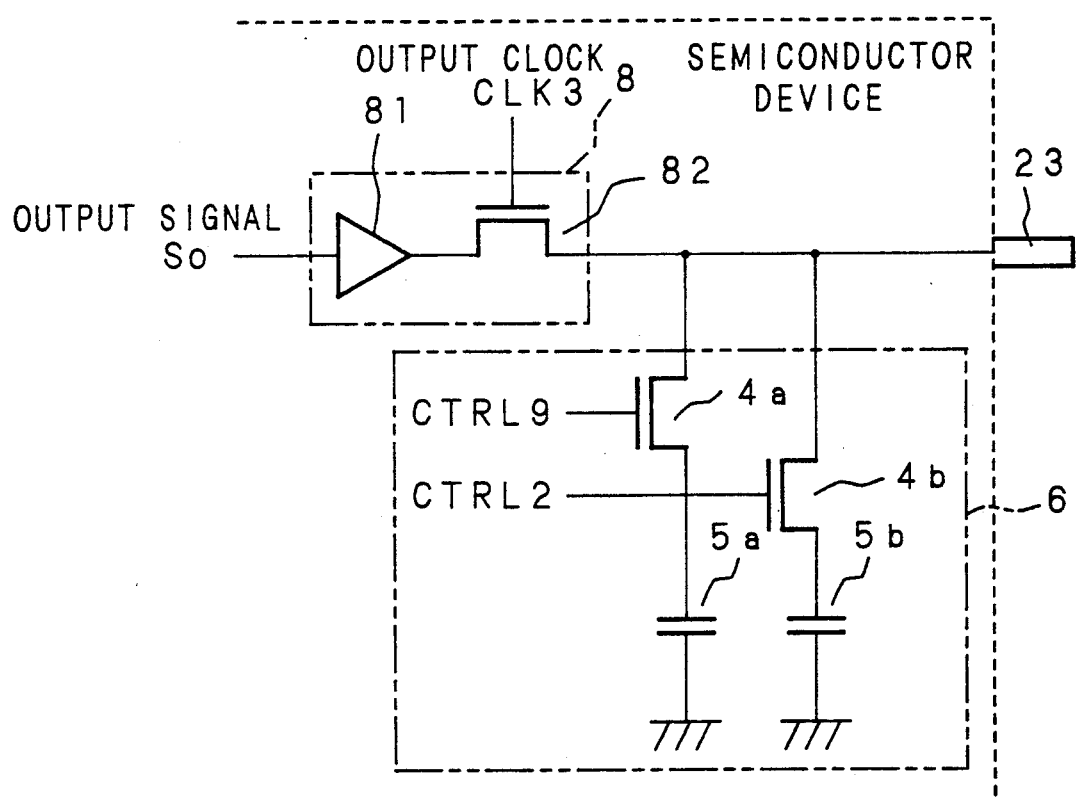
FIG. 12 illustrates the schematic block diagram of the semiconductor device of another embodiment related to the third invention.

Next, another embodiment of the third invention is described below. FIG. 12 illustrates the schematic block diagram of essential elements of the semiconductor device reflecting another embodiment of the third invention. Output signal So is transmitted to the delay circuit 6 of the first invention via an output circuit 8 composed of an output buffer 81 and an N-channel transistor 82 connected to each other in series, and then the output signal So is externally outputted via an output terminal 23. Output clock CLK3 is transmitted to the N-channel transistor 82. When the output clock CLK3 goes HIGH, on the basis of this timing, the output signal So is externally outputted via the output terminal 23. However, when the output signal So is transmitted to the other semiconductor device, if the output timing is not compatible with the AC characteristic of the other semiconductor device, the semiconductor device cannot process the output signal So. To prevent this, the delay circuit 6 properly establishes the delay amount in order that the output timing can accord with the AC characteristic of the other semiconductor device.

Figure 13:
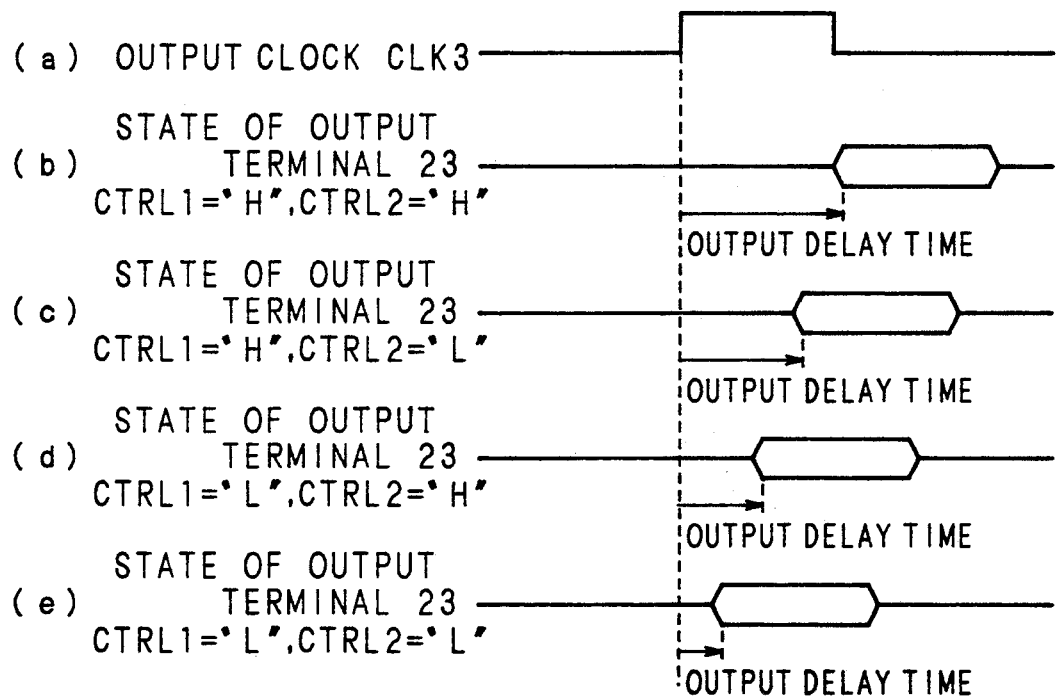
FIG. 13 illustrates the timing chart designating the output delay time.

FIG. 13 illustrates the timing chart designating the relationship between the states of the control signals and the delay amount (time) of the output signal. As shown in FIG. 13b through 13e, the output delay time corresponds to the sum of the delay amount of the delay circuit 6 and the delay time of the output circuit itself. The output delay time is maximum when the control signals CTRL1 and CTRL2 respectively remain HIGH, whereas the output delay time is minimum when both control signals remain LOW.

The above description has solely referred to the provision of two delay routes. Nevertheless, the scope of the invention is not merely confined to the two delay routes, but more than two of the delay routes can also be introduced to the embodiments of the invention as well.

As is clear from the foregoing description, according to the first invention, the delay circuit is composed of a plurality of delay routes each incorporating a plurality of switching elements and capacitors connected therebetween in series. Since these capacitors respectively contain such a capacity different from each other, and yet, since the delay amount can optionally be set according to the combination of opening and closing of switching elements, irrespective of the set number of the delay amount, there is no substantial increase of area occupied by the delay circuit, thus providing such a delay circuit occupying the least area. Furthermore, according to the second and third inventions, the delay circuit embodied by the first invention can properly be connected to other semiconductor devices each containing different AC characteristic by delaying internal clock pulse or input/output pulse signal without externally providing a special delay circuit, thus achieving an extremely useful semiconductor system.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A semiconductor device generating an output signal having a programmable setup time and hold time which can be matched to a setup time and hold time of an adjacent device coupled to the semiconductor device, the semiconductor device receiving a data pulse signal, comprising:

a plurality of series circuits connected in parallel, wherein each of said series circuits is composed of a capacitor and a switching element having an open position and a closed position determined in response to a control signal, said plurality of series circuits receiving the data pulse signal and delaying a pulse of said pulse signal by a time period defined by the number of series circuits having a switching element in the closed position, a delayed pulse being output from the plurality of series circuits; and means receiving a clock signal and the delayed pulse for latching the delayed pulse during an active transition of the clock signal, the latch generating an output signal based upon a logic level of the latched pulse, wherein the hold time portion of the received delayed pulse increases and the setup time portion of the received pulse decreases as the delay time period increases.

* * * * *

UNITED STATES PATENT AND TRADEMARK OFFICE
CERTIFICATE OF CORRECTION

PATENT NO. : 5,107,153
DATED : April 21, 1992
INVENTOR(S) : Akitoshi Osaki

It is certified that error appears in the above—identified patent and that said Letters Patent is hereby corrected as shown below:

Col. 4, line 67, "of" should be --or--.

Col. 5, line 31, "capacity" (second occurrence), should be --capacitor--.

Signed and Sealed this

Fourteenth Day of September, 1993

Attest:

BRUCE LEHMAN

*Attesting Officer*    *Commissioner of Patents and Trademarks*